(12) United States Patent
Yu et al.

(10) Patent No.: US 12,063,741 B2
(45) Date of Patent: Aug. 13, 2024

(54) POWER CONVERTER TRANSFORMER MODULE WITH PCBS CARRYING SECONDARY-SIDE RECTIFIER COMPONENTS

(71) Applicant: Bel Fuse (MACAO COMMERCIAL OFFSHORE) Limited, Macao (MO)

(72) Inventors: Hangdong Yu, Zhejiang (CN); Hai Huang, Zhejiang (CN); Hongliang Lu, Zhejiang (CN)

(73) Assignee: Bel Fuse (Macao Commercial Offshore) Limited, Macao (MO)

( * ) Notice: Subject to any disclaimer, the term of this patent is extended or adjusted under 35 U.S.C. 154(b) by 290 days.

(21) Appl. No.: 17/671,975

(22) Filed: Feb. 15, 2022

(65) Prior Publication Data

US 2022/0263421 A1 Aug. 18, 2022

Related U.S. Application Data

(60) Provisional application No. 63/150,171, filed on Feb. 17, 2021.

(51) Int. Cl.
*H05K 1/18* (2006.01)
*H05K 1/14* (2006.01)

(52) U.S. Cl.
CPC ............... *H05K 1/181* (2013.01); *H05K 1/14* (2013.01); *H05K 2201/10015* (2013.01); *H05K 2201/1003* (2013.01); *H05K 2201/10166* (2013.01)

(58) Field of Classification Search
USPC ................ 361/760, 764, 767–775, 782–784, 361/792–795, 803; 336/198–200
See application file for complete search history.

(56) References Cited

U.S. PATENT DOCUMENTS

| | | | | |
|---|---|---|---|---|
| 4,661,792 A | * | 4/1987 | Watkins | ................ H01F 27/027 336/198 |
| 6,040,778 A | * | 3/2000 | Hopkins | ................ G01R 31/52 315/129 |
| 6,944,033 B1 | | 9/2005 | Xu et al. | |
| 8,269,456 B2 | | 9/2012 | Hui | |
| 8,498,124 B1 | * | 7/2013 | Folker | ..................... H01F 27/06 361/740 |
| 8,923,010 B2 | * | 12/2014 | Parish | .................... H05K 1/145 361/752 |
| 9,148,066 B2 | * | 9/2015 | Chen | ..................... H02M 3/003 |

(Continued)

*Primary Examiner* — Tuan T Dinh
(74) *Attorney, Agent, or Firm* — BainwoodHuang

(57) ABSTRACT

A power converter includes a power transformer having a body housing two secondary windings, the body having first and second opposing and substantially parallel planar faces, each of the secondary windings having respective first coils and second coils having respective terminals. The terminals of the first coils extend through the first face of the transformer body, and the terminals of the second coils extend through the second face of the transformer body. The converter further includes two printed circuit boards (PCBs) each disposed at a corresponding face of the transformer body, each PCB carrying switches and capacitors of a respective rectifier circuit connected to the terminals of the coils of the respective secondary winding, each PCB including external connections for connecting the rectifier circuits in parallel to form an output of the power converter.

20 Claims, 7 Drawing Sheets

(56) References Cited

U.S. PATENT DOCUMENTS

| | | | |
|---|---|---|---|
| 9,837,927 B2 | 12/2017 | Yu et al. | |
| 10,581,319 B1* | 3/2020 | Lin | H02M 3/33553 |
| 2004/0108929 A1* | 6/2004 | Ichikawa | H01F 27/2823 |
| | | | 336/83 |
| 2007/0152795 A1* | 7/2007 | Zeng | H01F 27/2804 |
| | | | 336/212 |
| 2007/0194875 A1* | 8/2007 | Wang | H01R 13/719 |
| | | | 336/100 |
| 2010/0315190 A1* | 12/2010 | Haj-Maharsi | H01F 27/40 |
| | | | 336/192 |
| 2011/0074533 A1* | 3/2011 | Phadke | H01F 27/363 |
| | | | 336/150 |
| 2013/0077276 A1* | 3/2013 | Kippley | H02M 7/003 |
| | | | 361/784 |
| 2018/0068782 A1* | 3/2018 | Afsharian | H05K 7/209 |
| 2018/0109115 A1 | 4/2018 | Zhou et al. | |
| 2020/0161982 A1* | 5/2020 | Xie | H02M 1/08 |

\* cited by examiner

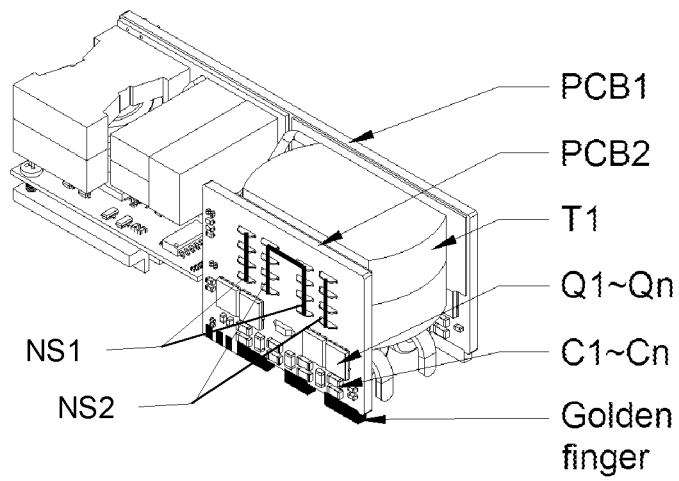
Fig. 10
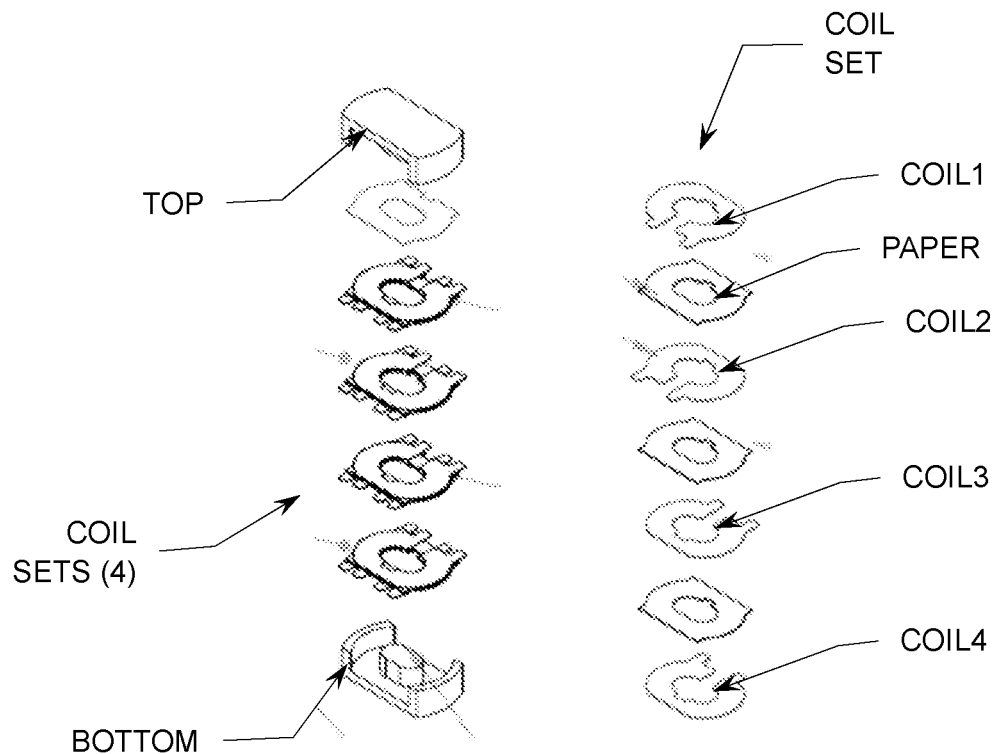
Fig. 11
Fig. 12

POWER CONVERTER TRANSFORMER MODULE WITH PCBS CARRYING SECONDARY-SIDE RECTIFIER COMPONENTS

BACKGROUND

The present invention relates to the field of power converters, and in particular to the field of DC/DC isolated converters such as high-voltage DC (HVDC) converters providing high power and high current output.

SUMMARY

A power converter is disclosed that includes a power transformer having a body housing two secondary windings, the body having first and second opposing and substantially parallel planar faces, each of the secondary windings having respective first coils and second coils having respective terminals. The terminals of the first coils extend through the first face of the transformer body, and the terminals of the second coils extend through the second face of the transformer body. The converter further includes two printed circuit boards (PCBs) each disposed at a corresponding face of the transformer body, each PCB carrying switches and capacitors of a respective rectifier circuit connected to the terminals of the coils of the respective secondary winding, each PCB including external connections for connecting the rectifier circuits in parallel to form an output of the power converter.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views.

FIG. 10 is a perspective depiction of the power transformer module of FIG. 7 including schematic representation of connections made by PCB2 for secondary windings NS1, NS2;

FIG. 11 is an exploded view of internals of a power transformer of the power transformer module;

FIG. 12 is an exploded view of a single coil set within the power transformer of FIG. 11;

DETAILED DESCRIPTION

Overview

Switching power supplies are very popular as their merit of small size, low weight, high efficiency, HVDC isolated converters are widely used in various fields such as communication and equipment control. One use for HVDC converters is in certain AC power supplies, which use a two-stage converter for the final DC output. The first stage is power factor correction (PFC) which converts the AC to HVDC source, and the second stage is an HVDC converter which converts the high voltage to a low voltage. This arrangement has a good output characteristic when using an optimized control strategy.

With the gradual spread of a variety of wide band semiconductor devices, the size of the first stage PFC circuitry is significantly reduced, which leads to reduced front-end (first stage) power input filter volume. To obtain commensurate overall size reduction, it is desirable to also reduce the size of the second stage HVDC as well. The miniaturization of the second stage HVDC may be limited by factors such as efficiency, thermal performance and total cost. In particular, in order to implement the miniaturization of the converter, one effective measure is to increase the operating frequency of the converter. But if frequency is too high, efficiency may be lowered accordingly. At the same time, as the size of the converter decreases, the thermal performance decreases, which imposes higher demands on the thermal design of the converter and a great challenge to the available space for the device layout of the converter.

Based on design requirements, the primary and secondary side energy conversion transformer structure in an HVDC converter may be realized in the following general ways:
1. One converter using a single transformer for energy transfer.
2. One converter using multiple transformers in series and parallel to transfer energy.
3. Two or more converters in parallel (outputs connected together) with interleaved operation through complex control.

Figure 1:
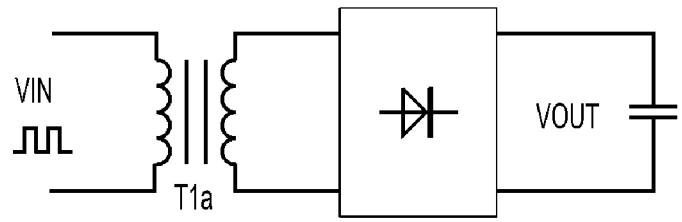
FIGS. 1-3 are schematic diagrams of high-voltage DC (HVDC) power supplies with different arrangements of transformers as known in the art.

FIG. 1 shows an example of the single-transformer arrangement (1) above with single transformer T1a. Here, the advantage is the simple and reliable circuit structure and low cost under the application conditions of low output voltage and high current. However, in the miniaturization design of the converter, as the switching frequency of the converter increases, the skin effect becomes more and more pronounced, especially for the secondary side copper winding. So, the effective copper cross-sectional area of the inner copper is not fully utilized in secondary side winding. At the same time, reducing the size of the transformer also affects the thermal performance, so it is necessary to find a good balance between the size and the thermal performance. Otherwise, a reliable thermal design is necessary. In addition, when the output of the converter is a high current application, a large number of surface-mount (SMD) switches need to be mounted on the secondary side, and it can be a challenge to balance layout placement for the switches and the transformer.

Figure 2:
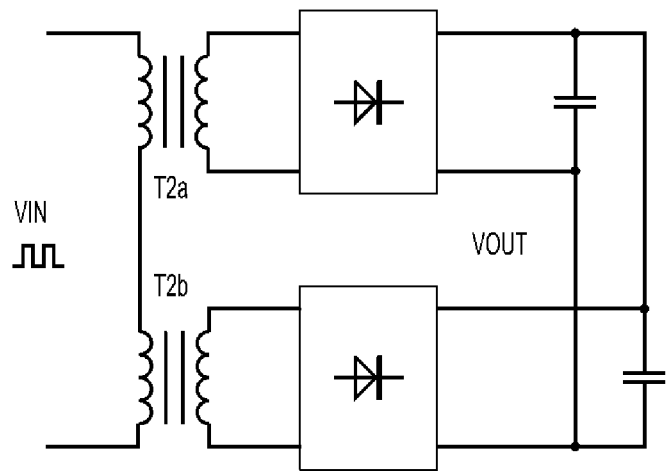

FIG. 2 shows an example of the series-parallel arrangement (2), employing two transformers T2a and T2b with their primary windings in series and their secondary windings in parallel. Generally speaking, two or more primary side windings are connected in series, while the corresponding secondary side windings are connected in parallel. This approach effectively simplifies the structural design of the windings within the transformer, increasing the heat dissipation area and having a positive effect on the thermal performance of the transformer. Due to having several windings in parallel, a single transformer current is reduced to the original 1/n, and the losses are also greatly reduced, which can improve the efficiency. And the drawback is the total size is big, limited by the safety requirement, so the layout is not easy.

Figure 3:
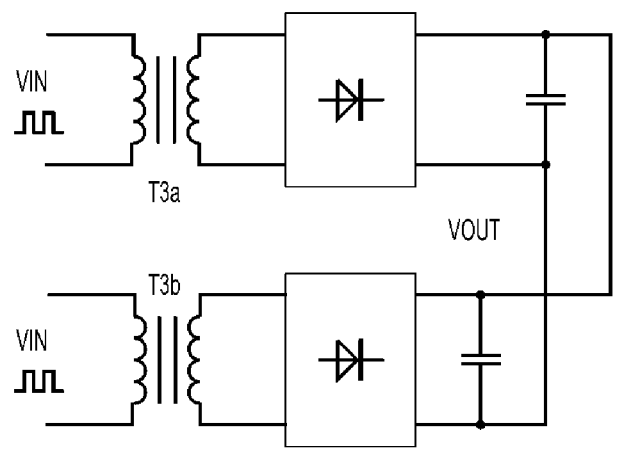

FIG. 3 shows an example of the interleaved arrangement (3), employing two transformers T3a and T3b in corresponding modules wired in parallel. Here, ideally both modules output half of the total power. Typically, the two modules are switched 180 degrees out of phase, so high-frequency current ripple on the input and output sides can be greatly decreased. Both AC and DC loss can be decreased, and the efficiency and the thermal performance improved accordingly. The disadvantage is that the number of power devices is doubled compared to the single-transformer arrangement (1); the material and production costs are relatively high; the overall size of the converter is relatively large; miniaturization is difficult; and, because of the need for current sharing between two modules, the control strategy is complicated and reliability may be relatively low.

Another known aspect of prior converter designs is that the secondary-side rectifier switches are mounted on a motherboard. The motherboard outline may be large, due to a large number of through-hole (THT) components mounted on it. Also, for cost reasons, such a motherboard may typically use a PCB of no more than 4 layers, and thus the current-carrying capacity of the motherboard is limited. Additionally, the motherboard may be located at the bottom of the power supply where fan air flow is relatively low, which adversely affects the heat dissipation of the secondary-side rectifier switches and thus affects the performance of the whole unit.

With a view to the above technical issues with HVDC converters, a new modular design concept is proposed to resolve the conflict between HVDC cost, conversion efficiency, overall size and overall thermal performance. This design combines the low-cost advantages of a single transformer and the high-efficiency features of a dual transformer through structure optimization, while improving the heat dissipation capacity of the module, ensuring product performance, controlling costs and improving overall performance.

As disclosed herein, the general approach in addressing the above needs and drawbacks is to configure the power converter to include a power transformer having a body housing two secondary windings, the body having first and second opposing and substantially parallel planar faces, each of the secondary windings having respective first coils and second coils having respective terminals. The terminals of the first coils extend through the first face of the transformer body, and the terminals of the second coils extend through the second face of the transformer body. The converter further includes two printed circuit boards (PCBs) each disposed at a corresponding face of the transformer body, each PCB carrying switches and capacitors of a respective rectifier circuit connected to the terminals of the coils of the respective secondary winding, each PCB including external connections for connecting the rectifier circuits in parallel to form an output of the power converter. This arrangement can provide the above-identified cost and efficiency advantages, including improved heat dissipation.

Embodiments

Figure 4:
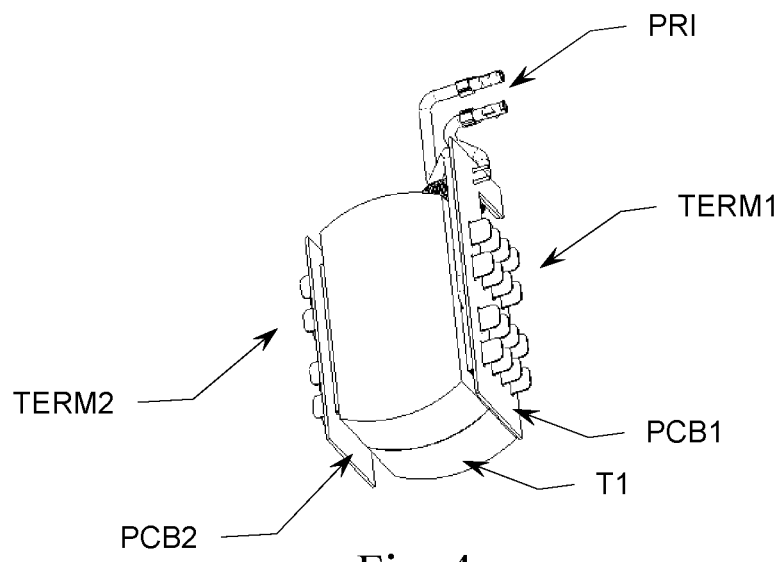
FIG. 4 is a perspective depiction of a power transformer module according to an embodiment of the invention.

FIG. 4 illustrates a power transformer module for a power converter according to one embodiment. It includes a power transformer T1 and two printed circuit boards PCB1, PCB2. Also visible are two primary-side conductors PRI for a primary winding of the transformer T1. The non-conductive outer part of the transformer T1 is referred to as the "body" (not separately numbered). The body houses a primary winding and two secondary windings, which are not visible except for the primary-side conductors PRI and two sets of TERM1, TERM2 of the secondary windings, which extend from the parallel faces of the transformer body and mate with corresponding features (e.g., through-holes) of PCB1 and PCB2. Additional details of the configuration of transformer T1 are provided below.

Overall, in this arrangement the power transformer T1 has coils of its output (secondary) windings extending in opposite directions, which are roughly left and right in FIG. 4, and the transformer is combined with two multilayer PCBs (PCB1, PCB2) to form a sandwich or I-like structure. As shown in the additional example of FIG. 5, PCB1 and PCB2 each preferably carry respective secondary-side rectifier circuitry including a number of switches Q1~Qn and a number of filter capacitors C1~Cn. In one embodiment, PCB1 and PCB2 are two-sided PCBs, and the devices Qx and Cx are surface-mount devices (SMDs).

The outgoing wires/terminals TERM1, TERM2 on each side of the transformer T1 constitute a symmetrical structure of the circuit, providing external connections for two secondary windings that are responsible for the electrical power transfer of positive and negative half-cycles of operation (see circuit examples and transformer details below). In the examples herein, the switches Qx on each PCB are connected in parallel to form a single switch ("Q") of larger effective size (~n times the size of the individual switches), and similarly the capacitors Cx on each PCB are connected in parallel to function as a single capacitor ("C") of larger effective size (~n times the size of the individual capacitors). Each of PCB1, PCB2 carries connections to form parts of two rectifier circuits that channel current from the secondary windings of T1 to the power converter output via a separate busbar, described below. These connections include, for each of the secondary windings:

1. The secondary terminals TERM for one end of the secondary winding are connected to one end of the switch Q;
2. The other end of the switch Q connects to one end of the capacitor C;
3. The other end of the capacitor C connects to the secondary terminals TERM for the other end of the secondary winding.

Thus, the three components transformer T1, switch Q and the filter capacitor C form a high-frequency current circuit. Since there is positive and negative semi-cycle symmetry in a switching cycle of the converter, and each of the positive and negative semi-cycle windings is responsible for half of the power transfer, there are also multiple high-frequency current circuits on the same side of the PCB including the switches and filter capacitors, and the number is even.

The overall structure can be adapted to different output voltages and different output powers for a wide range of applications by adjusting the turns ratio of the primary and secondary sides of the power transformer T1, the withstand voltage of the secondary side rectifier switches and the number of switches.

The carriers of the power transformer T1, the power switches Q, and the filter capacitor C, are multilayer PCBs (PCB1, PCB2) and are symmetrically distributed on both sides of the power transformer T1. According to the amount of the loss of the power supply, it is flexible to adjust the number of layers and thickness of the PCBs—the more layers, the thicker the PCB copper, such that current-carrying capacity is greater and thermal conductivity is stronger. This thermal conductivity over the multi-layer PCB and into the motherboard M1, through the motherboard M1 large area of copper, helps module heat dissipation.

Figure 5:
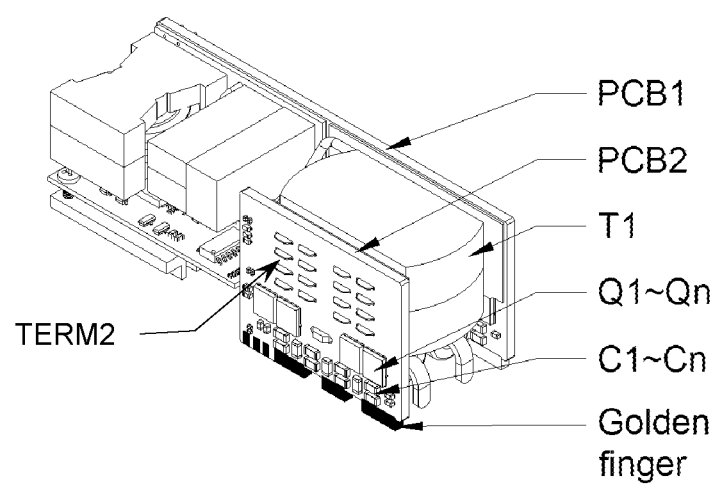
FIG. 5 is a perspective depiction of a power transformer module according to another embodiment of the invention.
Figure 7:
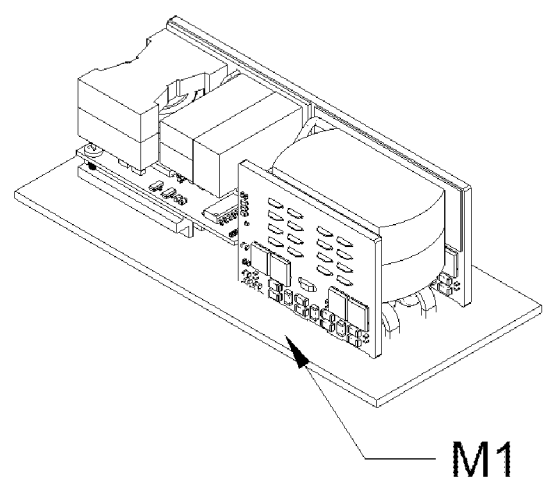
FIG. 7 is a perspective depiction of a power transformer module mounted to a printed circuit board, which may be a motherboard.

FIG. 5 and FIG. 7 show that PCB1 and PCB2 each have an upper portion that mates with the terminals TERMx of the secondary windings of the power transformer T1, and a lower or bottom portion carrying external connections to a separate motherboard M1 and having the switches Q and capacitors C disposed thereon. In on embodiment, the external connections at the PCB bottom edges include conductive, gold-plated fingers ("Golden fingers"). which are directly soldered to corresponding features (e.g., through holes) of the motherboard M1. As outlined above, this configuration can greatly increase the heat exchange capacity with the motherboard M1, while also reducing the solder impedance between PCB1, PCB2 and the motherboard M1, reducing DC losses.

In the illustrated arrangement, the power switch Q is mounted on an upright PCB (PCB1, PCB2), and a different number of switch tube packages can be arranged on both sides of the PCB, which provides flexibility of power expansion and can greatly improve heat dissipation efficiency of the switch Q compared to a traditional arrangement having the switch Q on the top and bottom of the motherboard M1. The power switches can be mounted on both inside and outside of two multilayer PCBs, and in the case of many switches, all of the switches can be placed close to the power transformer T1 terminals TERMx, and the high-frequency filter capacitors are also close to the power switch Q. This arrangement can minimize the high-frequency current circuit, and reduce the AC losses caused by high-frequency current.

Figure 6:
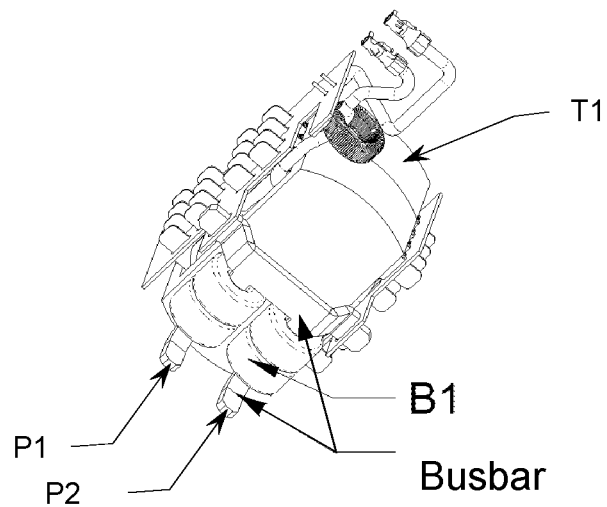
FIG. 6 is a perspective depiction of a power transformer module including a busbar and magnetic coils according to another embodiment of the invention.

FIG. 6 shows at a busbar (Busbar) can be added between PCB1, PCB2 on one side of the transformer T1 according to the demand, the bus bar providing parallel connecting of the rectifier circuits of PCB1, PCB2 and having one or more medial terminals (P1, P2) mating with corresponding features of the motherboard. One or more magnetic rings B1 (toroidal coil) can be placed on the Busbar (e.g., on terminals P1, P2 as shown) according to the demand, which can effectively reduce the current ripple of the output of the power module and reduce the current ripple pressure of the peripheral devices. The Busbar also may use multiple magnetic rings or cores to form a complete independent inductor, which can be used for different circuit topologies.

The arrangement having power transformer T1 with two-direction output structure, and closely arranged PCBs (PCB1, PCB2) carrying rectifier and filter circuitry, may be suitable for a wide variety of converter circuits, especially for resonant converters without filter inductors on the secondary side of the converter (so-called LLC resonant converters).

Figure 8:
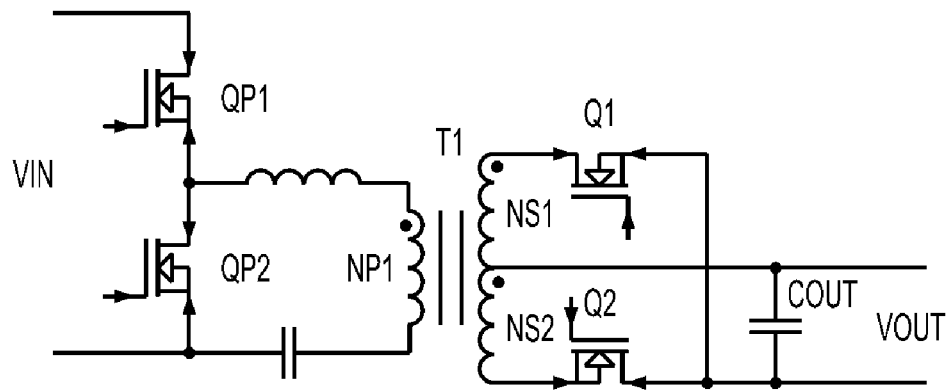
FIG. 8 is a schematic diagram of a resonant HVDC converter that may be realized using a power transformer module according to an embodiment of the invention.

FIG. 8 shows an example of an isolated LLC resonant converter circuit with full-wave rectification. The main circuit includes an isolated main power transformer T1, a synchronous rectifier Q1, a synchronous rectifier Q2, and a capacitor Cout. The power transformer T1 has a primary side winding Np, a first secondary side winding Ns1, and a second secondary side winding Ns2. The dotted terminals of first secondary side winding Ns1 connects to the drain of Q1 synchronous rectifier, the non-dotted terminals of the first secondary side winding Ns1 connects to the dotted terminals of the second secondary side winding Ns2 and also connects to one end of the capacitor Cout, and the other end of the capacitor Cout is connected to the source of the synchronous rectifier Q1 and the source of the synchronous rectifier Q2. The non-dotted terminals of the second secondary side winding Ns2 is connected to the drain of the synchronous rectifier Q2.

Figure 9:
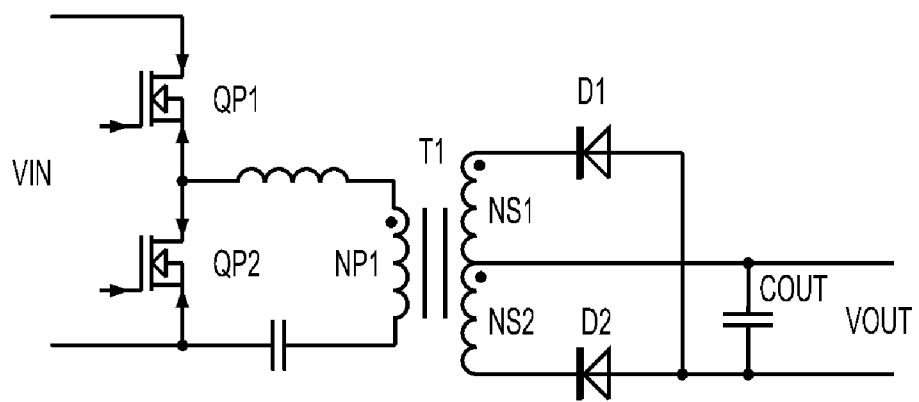
FIG. 9 is a version of the HVDC converter of FIG. 8 using diode rectification instead of synchronous rectifiers.

FIG. 9 shows an alternative employing diode rectification (D1, D2) on the secondary side rather than switching transistors such as Q1, Q2 of FIG. 8. Generally, the structure disclosed herein is not limited to the full-bridge or half-bridge LLC. The busbar mentioned above can be selectively installed in the LLC resonant converter to form a small inductor, which, combining with the output capacitors of the LLC converter, can effectively reduce the high-frequency ripple current of the output current.

FIG. 10 is another depiction of the power transformer module of FIG. 7 including schematic representations of the connections made by PCB2 for secondary windings NS1, NS2 (specifically, for the coils of NS1 and NS2 that terminate on PCB2; see details below). It will be appreciated that PCB1 makes similar connections for the coils of NS1 and NS2 that terminate on PCB1.

FIG. 11 is an exploded view of certain parts of the power transformer T1. Its insulating body has a Top and a Bottom, and internally it includes four (4) sets of secondary-side coils.

FIG. 12 shows that each of the 4 coil sets includes four coils (COIL1-COIL4) which are formed as flat, arc-shaped conductive members (e.g., copper sheet), interspersed with insulating layers such as insulating Paper. Within each set, the four coils make up parts of both NS1 and NS2, and extend to either PCB1 or PCB2 as follows:

COIL1: NS2, PCB2
COIL2: NS1, PCB2
COIL3: NS2, PCB1
COIL4: NS1, PCB1

Figure 13:
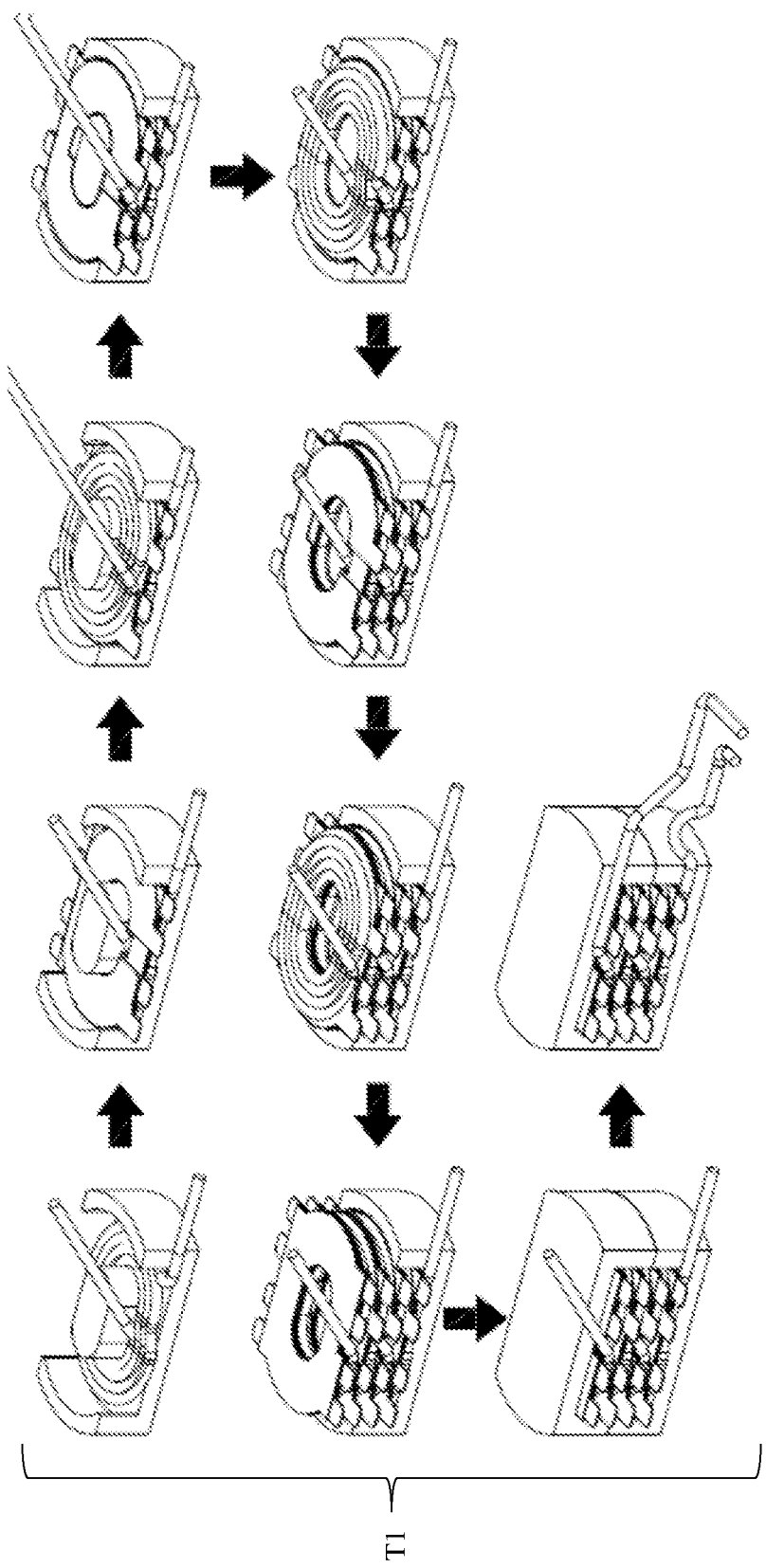
FIG. 13 is a depiction of the manner of making the power transformer and resulting internal structure.

FIG. 13 illustrates the manner of making the transformer T1 and its resulting internal structure, beginning at upper left and proceeding along the path indicated by arrows. First a layer of primary-side winding is made, then one Coil Set is placed on the winding. The operation is repeated three additional times, which results in a stack of four Coil Sets interspersed with primary-side winding layers. The exposed ends of the primary-side winding (last step) form the primary-side conductors PRI shown in FIG. 4.

Figure 14:
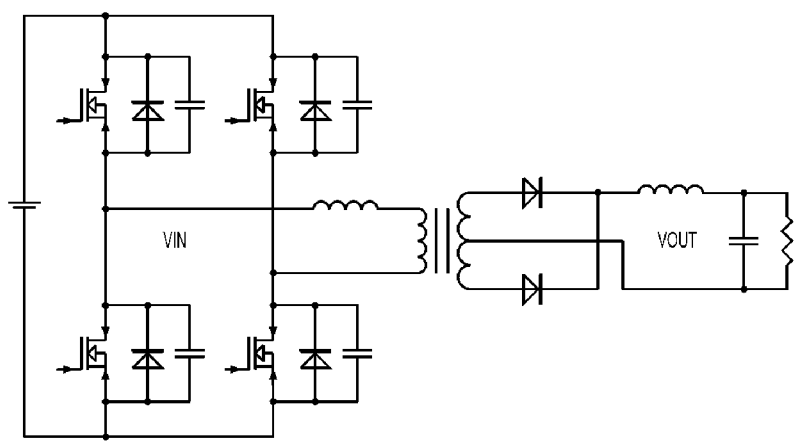
FIG. 14 is a schematic diagram of a resonant HVDC converter employing a phase-shifting primary-side full bridge.

FIG. 14 shows a phase shift full bridge circuit with zero-voltage-switch (ZVS) functionality, which is also suitable for HVDC applications. The aforementioned Busbar can be made into a fixed inductor by appropriately changing its structure and combining it with the appropriate magnetic core or magnetic ring B1, which can be used as the output Buck inductor of a full bridge converter in this application.

While various embodiments of the invention have been particularly shown and described, it will be understood by those skilled in the art that various changes in form and details may be made therein without departing from the scope of the invention as defined by the appended claims.

What is claimed is:

1. A power converter, comprising:
  a power transformer having a body housing two secondary windings, the body having first and second opposing and substantially parallel planar faces, each of the secondary windings having respective first coils and second coils having respective terminals, the terminals of the first coils extending through the first face of the transformer body, the terminals of the second coils extending through the second face of the transformer body; and two printed circuit boards (PCBs) each disposed at a corresponding face of the transformer body, each PCB carrying switches and capacitors of a respective rectifier circuit connected to the terminals of the coils of the respective secondary winding, each PCB including external connections for connecting the rectifier circuits in parallel to form an output of the power converter, wherein the coils of the secondary windings are arranged into multiple sets, each set including (1) a first coil of a first secondary winding terminating at a first PCB, (2) a second coil of the first secondary winding terminating at a second PCB, (3) a first coil of a second secondary winding terminating at the first PCB, and (4) a second coil of the second secondary winding terminating at the second PCB.

2. The power converter of claim 1, further including a motherboard at a bottom of the transformer body extending between the PCBs, and wherein the external connections of the PCBs are disposed at bottom edges of the PCBs and mate with corresponding features of the motherboard.

3. The power converter of claim 1, wherein the power transformer further includes a primary winding having primary conductors extending from the body and into one of the PCBs.

4. The power converter of claim 1, wherein, on each of the PCBs, the switches are connected in parallel to function as a single switch of larger size, and the capacitors are connected in parallel to function as a single capacitor of larger size.

5. The power converter of claim 1, further including a bus bar at a bottom of the transformer body extending between the PCBs, the bus bar providing the parallel connecting of the rectifier circuits to form the output of the power converter.

6. The power converter of claim 1, wherein the coils are formed as flat arc-shaped conductive members, and the sets are interspersed with respective coil sections of the primary winding of the power transformer.

7. The power converter of claim 1, wherein the switches are power transistors.

8. The power converter of claim 1, wherein the switches are power diodes.

9. The power converter of claim 2, wherein each of the PCBs has a bottom portion and an upper portion, the upper portion mating with the terminals of the respective secondary winding of the power transformer, the bottom portion carrying the external connections and having the switches and capacitors disposed thereon.

10. The power converter of claim 2, further including a bus bar at the bottom of the transformer body extending between the PCBs, the bus bar providing the parallel connecting of the rectifier circuits and having one or more medial terminals mating with corresponding features of the motherboard.

11. The power converter of claim 2, wherein the external connections of the PCBs are formed by conductive fingers extending downwardly from the respective edges and into the motherboard.

12. The power converter of claim 3, wherein the one PCB further includes additional components of a primary-side circuit connected between an input of the power converter and the primary conductors.

13. The power converter of claim 5, further including one or more toroidal coils on the busbar to provide inductance that combines with capacitance of the capacitors to reduce high-frequency ripple current of output current.

14. The power converter of claim 7, wherein the power transistors are field-effect transistors.

15. A power converter, comprising:
a power transformer having a body housing two secondary windings, the body having first and second opposing and substantially parallel planar faces, each of the secondary windings having respective first coils and second coils having respective terminals, the terminals of the first coils extending through the first face of the transformer body, the terminals of the second coils extending through the second face of the transformer body;

two printed circuit boards (PCBs) each disposed at a corresponding face of the transformer body, each PCB carrying switches and capacitors of a respective rectifier circuit connected to the terminals of the coils of the respective secondary winding, each PCB including external connections for connecting the rectifier circuits in parallel to form an output of the power converter;

a bus bar at a bottom of the transformer body extending between the PCBs, the bus bar providing the parallel connecting of the rectifier circuits to form the output of the power converter; and one or more toroidal coils on the busbar to provide inductance that combines with capacitance of the capacitors to reduce high-frequency ripple current of output current.

16. The power converter of claim 15, further including a motherboard at the bottom of the transformer body extending between the PCBs, and wherein the external connections of the PCBs are disposed at bottom edges of the PCBs and mate with corresponding features of the motherboard.

17. The power converter of claim 15, wherein the power transformer further includes a primary winding having primary conductors extending from the body and into one of the PCBs.

18. The power converter of claim 16, wherein each of the PCBs has a bottom portion and an upper portion, the upper portion mating with the terminals of the respective secondary winding of the power transformer, the bottom portion carrying the external connections and having the switches and capacitors disposed thereon.

19. The power converter of claim 15, wherein, on each of the PCBs, the switches are connected in parallel to function as a single switch of larger size, and the capacitors are connected in parallel to function as a single capacitor of larger size.

20. The power converter of claim 17, wherein the one PCB further includes additional components of a primary-side circuit connected between an input of the power converter and the primary conductors.

* * * * *